United States Patent
Chu et al.

(10) Patent No.: US 6,251,835 B1
(45) Date of Patent: Jun. 26, 2001

(54) SURFACE PLANARIZATION OF HIGH TEMPERATURE SUPERCONDUCTORS

(75) Inventors: Wei-Kan Chu, Pearland, TX (US); Judy Z. Wu, Lawrence, KS (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/073,786

(22) Filed: May 6, 1998

Related U.S. Application Data

(60) Provisional application No. 60/045,967, filed on May 8, 1997.

(51) Int. Cl.$^7$ .............................. B05D 1/00; C30B 33/00; C30B 31/00
(52) U.S. Cl. .............................. 505/411; 505/500; 117/3; 117/4; 117/7; 438/710; 438/720; 438/722
(58) Field of Search .................................. 117/4, 7, 8, 9, 117/3; 505/411, 480, 500; 438/710, 722, 720

(56) References Cited

U.S. PATENT DOCUMENTS

| | | | |
|---|---|---|---|
| 4,559,096 | 12/1985 | Friedman et al. | 156/272.2 |
| 5,439,877 | * 8/1995 | Face | 505/475 |
| 5,439,879 | * 8/1995 | Salama et al. | 505/500 |
| 5,459,326 | * 10/1995 | Yamada | 250/398 |
| 5,525,586 | * 6/1996 | Singh et al. | 505/490 |
| 5,527,767 | * 6/1996 | Setsune et al. | 505/480 |
| 5,547,922 | * 8/1996 | Ma | 505/325 |
| 5,856,277 | * 1/1999 | Chen et al. | 505/452 |

OTHER PUBLICATIONS

"The Role of Damage in the Annealing Characteristics of Ion Implanted Si"; by Billy L. Crowder, J. Electrochem Soc.: Solid State Science, May 1970; IBM T.J. Watson Research Center, Yorktown Heights, New York; pp. 671–674.

"Sources of variation in Therma Wave measurements of ion implanted wafers"; by Kamenitsa et al., Nuclear Instruments and Methods in Physics Research B74 (1993) pp. 234–237.

"Monte Carlo Simulation of Surface Smoothing Effect by Cluster Ions"; by Hagiwara et al., Ion Beam Engineering Experimental Lab., Kyoto University, Sakyo, Kyoto, 606–8501, Japan; pp. 1230–1233.

"Molecular dynamics simulation of damage formation by cluster ion impact"; by Aoki et al., Ion Beam Engineering Experimental Laboratory, Kyoto University, Sakyo, Kyoto 606–01, Japan; Nuclear Instruments and Methods in Physics Research B 121 (1997) pp. 49–52.

"Surface processing by gas cluster ion beams at the atomic (molecular) level"; by Yamada et al., Ion Beam Engineering Experimental Laboratory, Kyoto University, Sakyo, Kyoto 606, Japan, pp. 781–785.

"Reactive Accelerated Cluster Erosion (Race) For Micromachining"; by J. Gspann, Application of Accelerators in Research and Industry, New York 1997; pp. 503–505.

(List continued on next page.)

Primary Examiner—Benjamin L. Utech
Assistant Examiner—Matthew Anderson
(74) Attorney, Agent, or Firm—Perkins, Smith & Cohen, LLP; Jacob N. Erlich; Jerry Cohen

(57) ABSTRACT

Planarizing High Temperature Superconductor (HTS) surfaces, especially HTS thin film surfaces is crucial for HTS thin film device processing. Disclosed is a method of surface planarization for HTS film. The method includes first smoothing the HTS surface by Gas Cluster Ion Beam bombardment, followed by annealing in partial pressure of oxygen to regrow the damaged surface layer. A rough HTS surface can be planarized down to a smoothness with a standard deviation of one nanometer or better.

56 Claims, 9 Drawing Sheets

OTHER PUBLICATIONS

"Sputtering effect of gas cluster ion beams"; by Yamaguchi et al., Nuclear Instruments and Methods in Physics Research B 99 (1995) Ion Beam Engineering Experimental Laboratory, Japan; pp. 237–239.

"Molecular dynamics simulation of cluster ion bombardment of solid surfaces"; by Insepov et al., Ion Beam Engineering Experimental Laboratory, Japan; pp. 248–252.

"Ion beam thinning and polishing of $Yba_2Cu_3O_7$ films" by Hebard et al., 1989 American Institute of Physics; Appl. Phys. Lett. 55 (18) Oct. 30, 1989; pp. 1915–1917.

Brown, Walter L. and Sosnowski, Marek, "Cluster–Solid Interaction Experiments," *Nuclear Instruments and Methods in Physics Research*, (1995): 305–311.

Yamada, I., "Ionized Cluster beam Technique Newly Established Ion–Surafce Interaction Processing and Their Application to Advanced Surface Processing" *Proceedings of the Symposium on Ion & Laser Processing for Advanced Materials*, (1994): 55–63.

Matsuo, Jiro and Yamada, Isao, "Lateral Sputting by Gas Cluster Ion Beams and its Applications to Atomic Level Surface," *Materials Research Society Symposium Proceedings*, vol. 396 (1996): 149–154.

J.A. Northby et al, "A Method and Apparatus for Surface Modification by Gas–Cluster Ion Impact," *Nuclear Instruments and Methods in Physics Research*, (1993): 336–340.

W.K. Chu et al. "Smoothing of $Yba_2 Cu_3O_{7-\epsilon}$ Films by Ion Cluster Beam Bombardment, " *American Institute of Physics*, (1998): 246–248.

Yamada, I., "Lateral Sputtering by Gas Cluster Ion Beams and its Applications to Atomic Level Surface Modification," Material Research Society Symposium Proceedings, vol. 396, pp. 149–154, 1996.*

\* cited by examiner

SURFACE PLANARIZATION OF HIGH TEMPERATURE SUPERCONDUCTORS

PRIORITY INFORMATION

This application claims priority from provisional application Ser. No. 60/045,967 filed May 8, 1997.

BACKGROUND OF THE INVENTION

The invention relates to processing high temperature superconductor surfaces.

High Temperature Superconductor (HTS) thin films are intrinsically not smooth. HTS thin films deposition is made mostly by four different processes: pulsed laser ablation, magnetron sputtering, vapor phase evaporation, and metal organic chemical vapor deposition (MOCVD). In order to promote the epitaxy of the HTS film on a selected substrate which in turn provides the template of the crystalline growth, substrates are usually kept at an elevated temperature during HTS film deposition. Due to the nucleation and growth, islands or mesas are formed on the substrates to produce a rough surface. Typical peak to valley surface height variation ranges from 10 nm to 30 nm, and interpeak distance ranges from 0.3 micron to 0.6 micron.

For the fabrication of high temperature superconductor thin film devices, especially digital circuits or HTS interconnects in multi-chip modules (MCM), a smooth surface is crucial to the reliability and yield of the fabrication process. A rough surface is detrimental to the growth and performance of additional layer(s) on top of the film and becomes a reliability and yield killer to the large scale production of thin film devices.

There are many different ways to planarize a surface. For example, a non-smooth surface can be mechanically polished by lapping the surface with or without filler material. A rough surface, or a surface with steps, lines or structures can be planarized by first filling the surface with photoresist, spin-on-glass, or some polymer, then etched back chemically, or etched back by use of ion beam sputtering. A rough surface can also be smoothed by ion beam sputtering of the surface at a glancing angle within 4 degrees from the surface.

All existing methods have their problems. Mechanical lapping, and filling subject the surface to different materials which complicate the process, and detract from the yield in IC processing. Glancing angle sputtering is slow and difficult to control. Due to the above mentioned problems on existing planarization methods, HTS thin film devices are generally fabricated without surface smoothing procedures. As a consequence, devices have reliability and yield problems. The absence of a new method to planarize the HTS surface is impeding the progress of HTS thin film applications to devices.

It has been demonstrated that the bombarding effects of gas cluster ions on solid surfaces are quite different from those produced by monomer ion beams. Monomer ion beam sputtering is a well established technology in ion etching for surface layer removal, and in ion implantation. During monomer ion sputtering, the target atoms are removed layer by layer, a process that does not significantly alter the surface morphology. However, gas cluster ions contain hundreds or even thousands of atoms or molecules. The total energy of the cluster ranges from a few keV to a few tens of keV, which corresponds to several eV to several tens of eV per constituent atom. When the gas cluster hits the target surface, the collective motions of the cluster atoms during impact play dominant roles in the process kinetics. Computer simulation using molecular dynamics has shown the collective effect of gas cluster ion beams (GCIB) gives shallower, but massive damage and lateral sputtering. Due to the GCIB lateral sputtering effect, surfaces of Au, Pt, Cu, poly-Si, $SiO_2$, $Si_3N_4$, Si, and other materials, can be smoothed.

All conventional GCIB applications to date have involved semiconductors and metals. Demonstrations of shallow ion implantation, surface smoothing, high rate sputtering, and thin film deposition have been made. All cases demonstrated so far are simple systems involving single elements such as poly-Si, or diamond, Au, Pt, Cu, or binary compounds such as $SiO_2$ or $Si_3N_4$. High temperature superconductors such as $Y_1Ba_2Cu_3O_7$ (YBCO) involve 13 atoms per unit cell of four different elements, and are very complicated as compared to the simple mono-element and binary compounds.

SUMMARY OF THE INVENTION

The invention involves applying GCIB to planarize HTS surfaces. Specifically, it is an object of the invention to provide the application of GCIB on YBCO surface by varying beam parameters, characterizing the treated surfaces, and producing smooth surfaces. In addition, the invention utilizes Rutherford Backscattering Spectrometry in combination with channeling effect to monitor the surface damage due to GCIB, and includes methods to repair the damage and make the surface useful for device processing. The invention also involves the regrowth of an epitaxial YBCO layer on top of the smoothed and repaired surface.

The invention provides a method of surface planarization for HTS films. The method includes first smoothing the HTS surface by Gas Cluster Ion Beam Bombardment, followed by annealing in a partial pressure of Oxygen to regrow the damaged surface layer. A rough HTS surface can be planarized down to a smoothness with a standard deviation of one nanometer or better.

DETAILED DESCRIPTION OF THE ILLUSTRATED EMBODIMENTS

Figure 1:
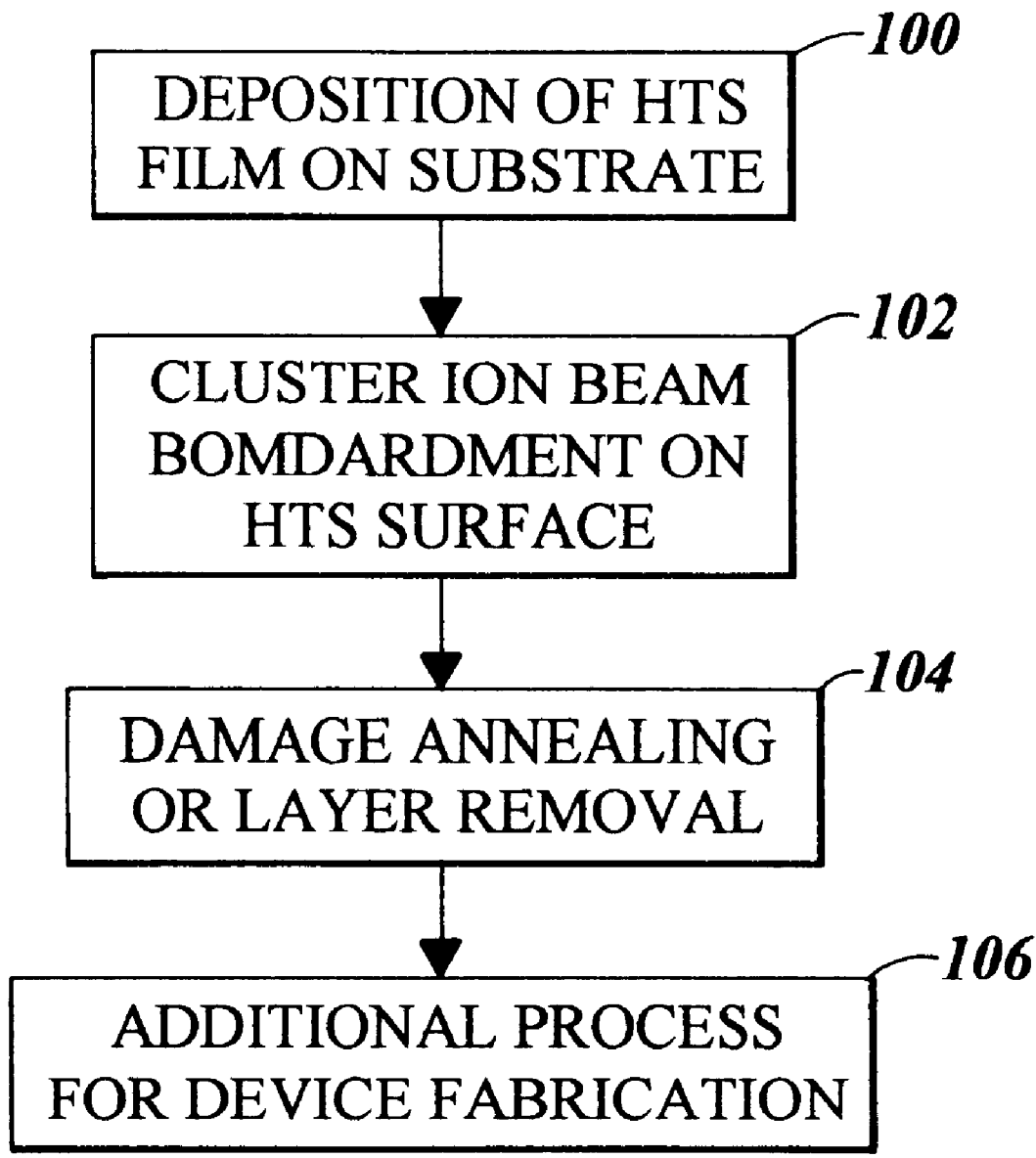
FIG. 1 is a flow chart of the HTS thin film planarization processing in accordance with the invention.

FIG. 1 is a flow chart of the GCIB surface smoothing and damage repair sequence in accordance with the invention. In step 100, deposition of HTS films on a substrate is done in a conventional manner. Various HTS films, such as Y—, T1, Hg-HTS cuprates can be deposited on single crystalline or multi-crystalline substrates, such as SrTiO$_3$, LaAlO$_3$, MgO, or other substrates with or without buffer layers.

Deposition methods such as pulsed laser ablation, magnetron sputtering, vapor phase evaporation, and metal organic chemical vapor deposition (MOCVD) can be used. Typically, to obtain films with excellent superconducting properties requires a heated substrate at elevated temperatures during the deposition process, and/or a post heat treatment of the deposit. Due to the nucleation and growth process, the surface of the film is not smooth.

Figure 2:
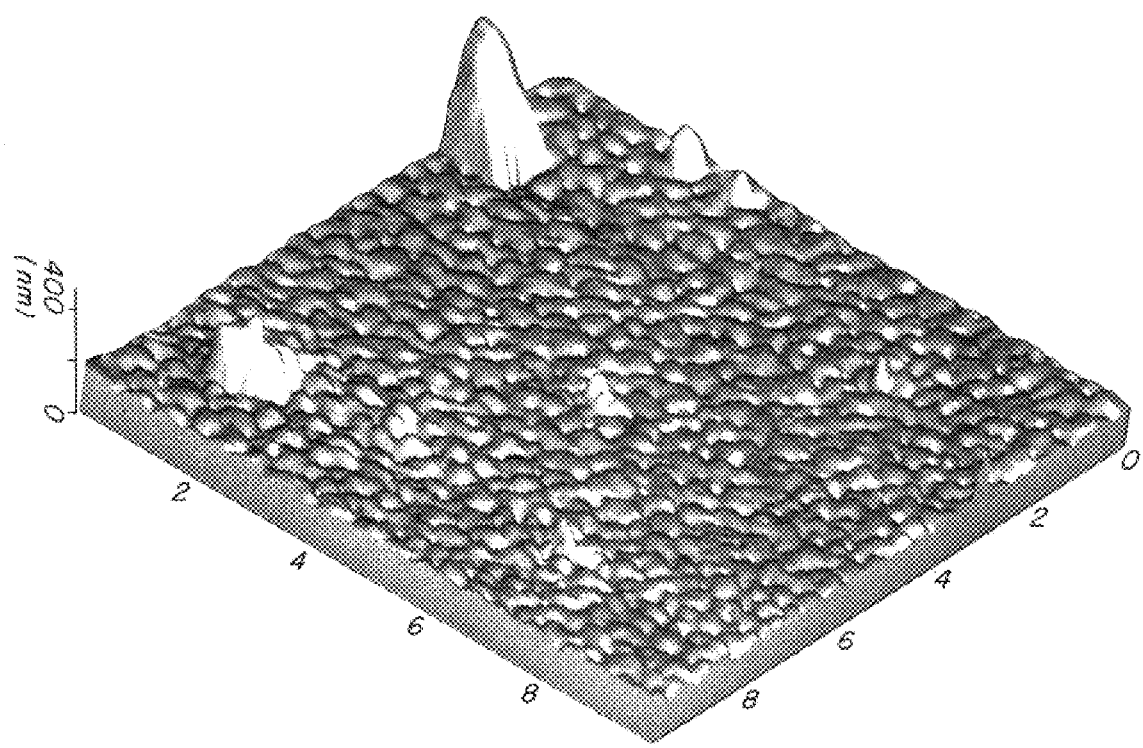
FIG. 2 is an atomic force microscope (AFM) picture of a YBCO film deposited by pulsed laser ablation.

A typical landscape of a YBCO HTS film produced by pulsed laser ablation on a LaAlO$_3$ substrate is shown in FIG. 2. FIG. 2 is an atomic force microscope (AFM) picture of a YBCO film deposited by pulsed laser ablation. The area coverage is 10 microns square with height scale of 400 nm. The surface smoothness standard deviation Ra=13 nm for large areas, and =9 nm for smaller areas that excluded the large peaks. It will be appreciated that the picture is made by AFM, which gives an amplified height scale. Due to the variation of growth speed along various crystalline directions during deposition, islands or mesas are formed on the substrates, and they merge into a complete layer with rough surfaces.

Figure 3:
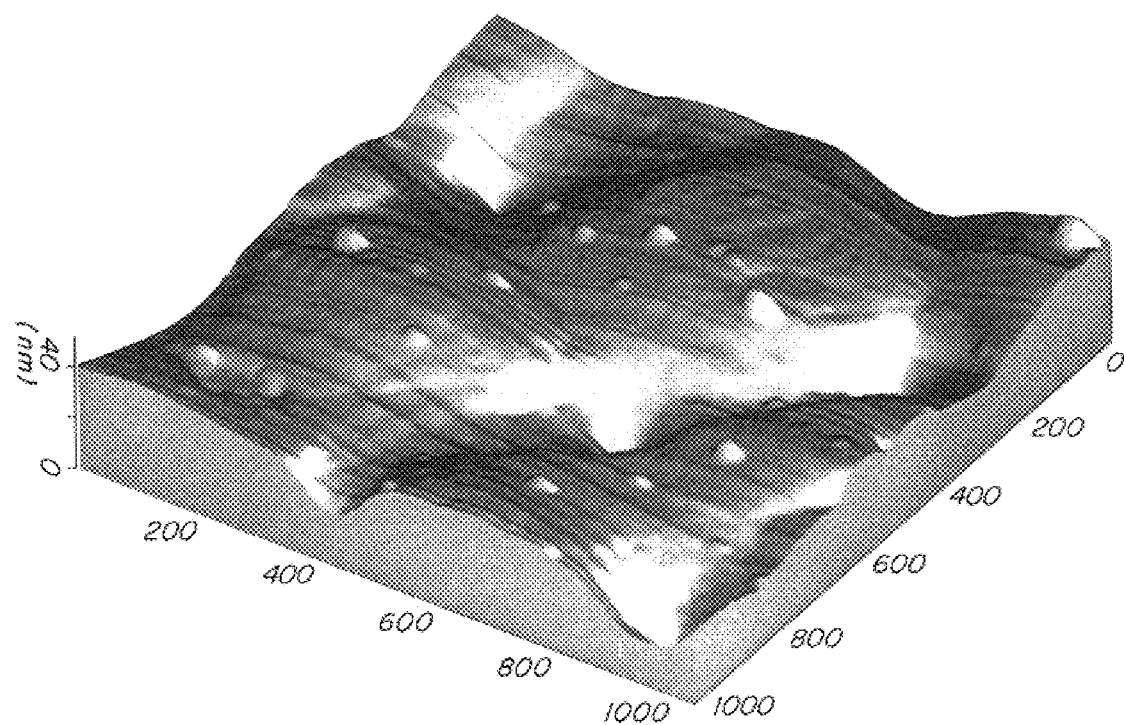
FIG. 3 is an enlarged view of a 1 micron square area of FIG. 2.

FIG. 3 shows a smaller area 1 micrometer square with a peak height of 40 nm and Ra=7 nm. Typical peak to valley surface height variations range around 10 nm to 30 nm with surface smoothness standard deviation of between 5 nm to 10 nm. Additional debris and impurity phases cause additional non-uniformity as seen in FIG. 2. Debris and impurity phases (peaks as high as 20 nm to 60 nm) can be avoided by processing control. However, in the deposited film. the surface is intrinsically not smooth such as shown in FIG. 2, and enlarged in FIG. 3.

The method of the invention continues in FIG. 1 with a gas cluster ion beam bombardment of the HTS surface in order to smooth the rough surface (Step 102). GCIB bombardment requires the use of a GCIB accelerator. Description of such equipment is provided in Yamada et al., "Lateral Sputtering of Gas Cluster Ion Beams and its Application to Atomic Level Surface Modification", Mat. Res. Soc. Symp. Proc., vol. 396. pp. 149–154 (1996). Briefly, the cluster beams of the gases, such as Ar, Ne, N$_2$, O$_2$, CO$_2$, SF$_6$, etc. are formed by supersonic expansion through a small nozzle into high vacuum. Collimated neutral gas cluster beams are ionized by electron bombardment in a multiple-stage high-vacuum chamber. Ionized cluster beams are extracted and particular sizes of cluster ions can be selected by an electrostatic lens system consisting of several electrostatic field plates with small apertures. The mass selected cluster ions are then electrostatically accelerated towards the target to have total energies in a range of a few keV to 200 keV. Extensive testing of gas cluster beam formation, cluster sizes, their extraction, and acceleration, versus various machine parameters such as inlet pressure, and focusing requirement are also documented by Yamada and Matsuo.

Figure 4:
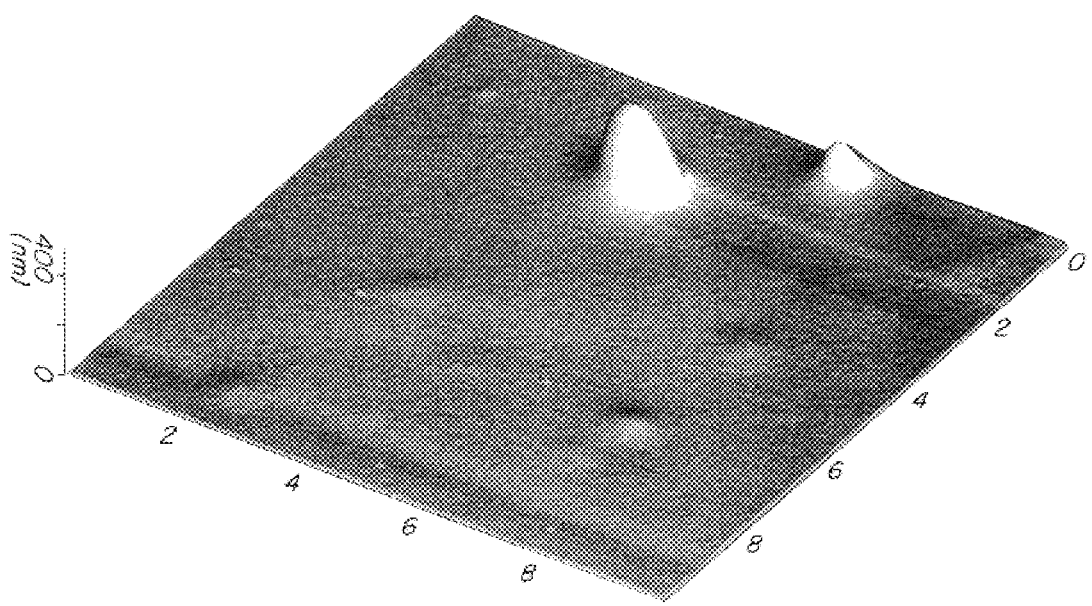
FIG. 4. is an AFM picture of a surface smoothed using an Ar gas cluster.

After GCIB bombardment, the surface of the YBCO film can be smoothed significantly. For example, FIG. 4 is an AFM picture of a surface smoothed using Ar clusters (around 3000 atoms per cluster) of 20 keV with a total dose of $5\times10^{15}$ clusters/cm$^2$. The standard deviation of the surface smoothness improved from Ra=13 nm (in FIG. 2) to 7 nm. If one only measures the flat area, excluding the debris peaks, Ra is as smooth as 1.3 nm as shown in FIG. 4.

Figure 5:
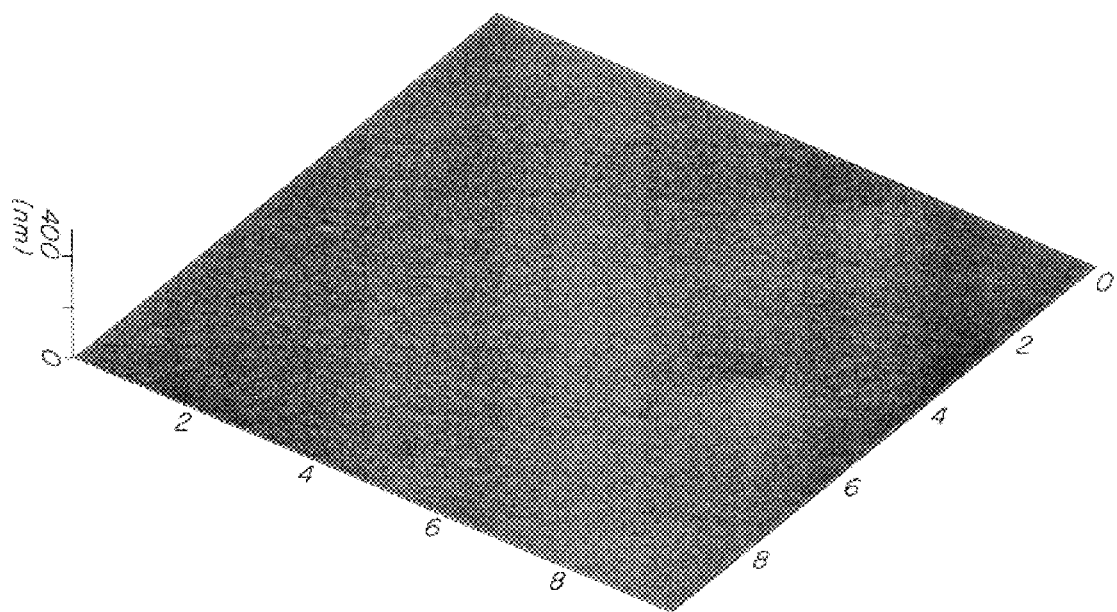
FIG. 5 is an AFM picture of a surface irradiated with $2 \times 10^{16}$ clusters/cm$^2$ with nearly all mountains or peaks flattened.

FIG. 5 is an AFM picture of a surface smoothed with $2\times10^{16}$ clusters/cm$^2$, where nearly all mountains or peaks are flattened. The surface smoothness standard deviation is improved to 0.8 nm. In experiments testing the smoothing procedures on ten samples and under various rough starting conditions, improvement was obtained in all cases. The starting surfaces had roughnesses ranging between 6 nm to 31 nm. After GCIB bombardment, the roughnesses were reduced to 0.8 to 3 nm.

The GCIB smoothing result is caused by a collective effect of lateral sputtering which fills up the valleys with material from the high ground. Once the landscape becomes flat, the GCIB bombardment removes the surface uniformly. The smoothing and sputtering with Ar clusters at 10, 20 and 30 keV with dosages between $10^{14}$ to $2\times10^{16}$ clusters/cm$^2$ has been studied. The size of the Ar cluster in these studies is estimated to be 3000 atoms. The size distribution of the Ar clusters is very broad with most of the population between 1000 and 5000 Ar atoms.

Figure 6:
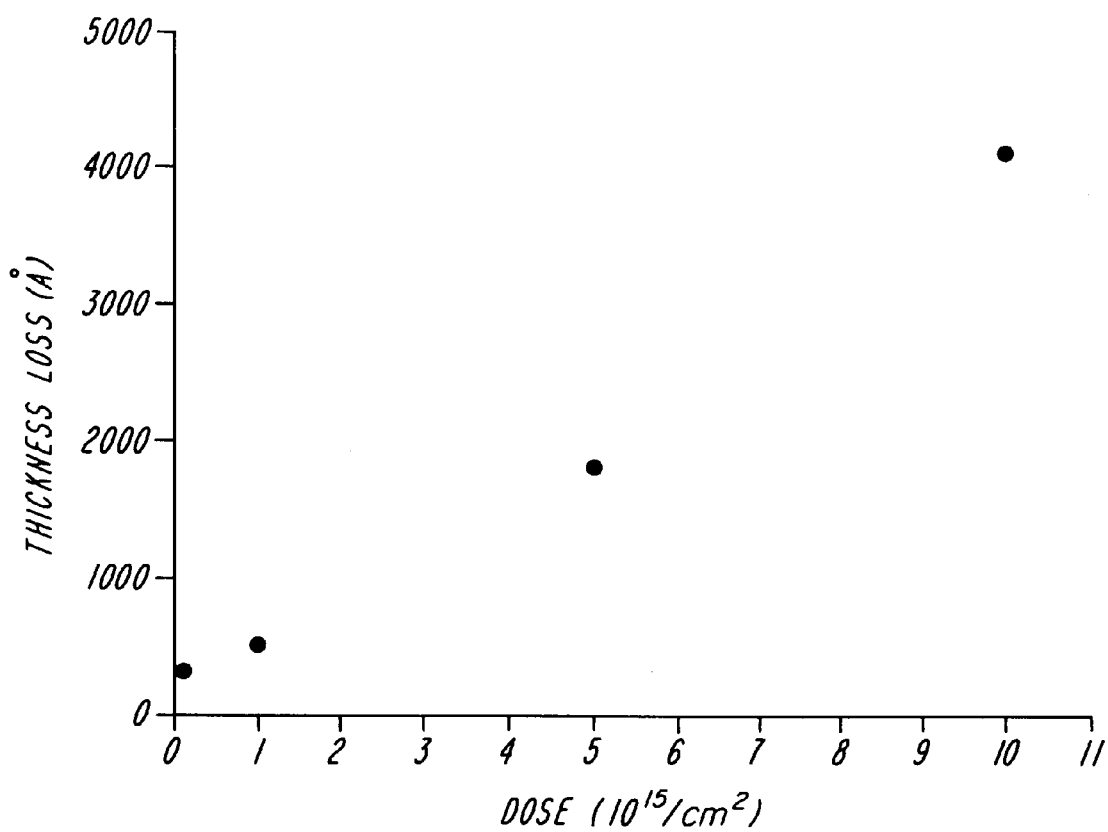
FIG. 6 is a graph showing the average YBCO thickness removed versus doses of the GCIB for a 30 keV Ar cluster beam.

The average thickness of the layer removed is directly proportional to the total amount of dosage used in the bombardment. For example, at $10^{15}$ clusters/cm$^2$, 20 keV Ar cluster bombardment removes 22 nm of YBCO. At $10^{16}$ clusters/cm$^2$, (ten times the previous exposure) 220 nm of YBCO is removed. FIG. 6 is a graph showing the average YBCO thickness removed versus dose of the GCIB for 30 keV Ar cluster beams.

Figure 7:
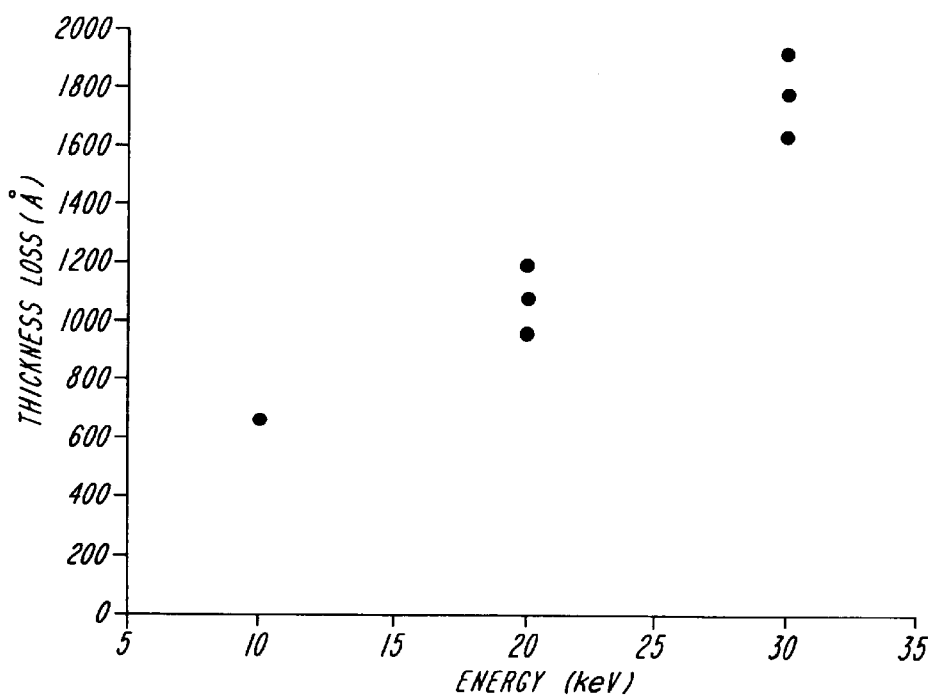
FIG. 7 is a graph showing the thickness removed versus total energy of a cluster at $5 \times 10^{15}$ clusters/cm$^2$ in which two measurements were made using two different samples for 20 keV and 30 keV GCIB.

The layer removal rate, or sputtering rate normalized with dosages, is a strong function of energy. In the energy region studied, the higher the energy, the higher the YBCO layer removal rate. For example, at $5\times10^{15}$ clusters/cm$^2$, 10 keV clusters remove 68 nm, 20 keV clusters remove 110 nm, and 30 keV clusters remove 180 nm. Rutherford Backscattering Spectrometry (RBS) is used to measure the YBCO layer thickness, before and after the GCIB smoothing. The difference in layer thickness before and after the GCIB bombardment yields the layer removal, and provides the sputtering rate measurement. FIG. 7 is a graph showing the thickness removed versus total energy of the cluster at $5\times10^{15}$ clusters/cm$^2$ in which two measurements were made using two different samples for 20 keV, and 30 keV GCIB, respectively, average values are also plotted between the two measurements.

During the GCIB bombardment for surface removal and smoothing, one of the undesirable effects is the damage underneath the bombarded area, due to total amorphorization of the crystalline structure. The damage formation has been quantified by RBS in combination with channeling effect. Based on RBS channeling peak spectra, the surface damage amounts to 15 to 20 nm. For a sample not bombarded by GCIB, the channeling surface peak gives 3–6 nm of surface damage as a background measurement. This is due to the combination of top monolayer dechanneling, and to possible degradation of the surface layer to moisture and carbon dioxide. This background surface damage amounts to 3 to 6 unit cell thicknesses. By subtracting the background channeling surface peak, the surface damage due to GCIB treatment is determined to be 10 to 15 nm. This damage layer needs to be removed for further device processing; otherwise, it will impede all superconducting properties required for device performance.

The GCIB surface damaged layer can be removed by chemical etching or by ordinary ion sputtering layer removal. Since the surface is already smoothed within 1 nm, with an uniform damaged surface layer of 10 to 15 nm, standard layer removal methods such as etching or sputtering will not disturb the flatness of the layer after this damage layer is removed. Another method to remove the damaged layer is by annealing in a partial oxygen ambient atmosphere.

Annealing (Step 104) is a preferred method for damage removal, especially for an in-situ processing procedure. In an in-situ processing case, thin films can be deposited, smoothed by GCIB, then damage annealed all inside an environmentally controlled chamber for device processing. In-situ processing will improve the device fabrication yield significantly.

The effect of annealing of a GCIB damaged layer has been studied by channeling in combination with RBS. Examples of channeling spectra are given in FIGS. 8A–C. It has been found that the damaged surface can be restored to its original state. Two different annealing schedules have been carried out for recovering the shallow surface damage.

Figure 8A:
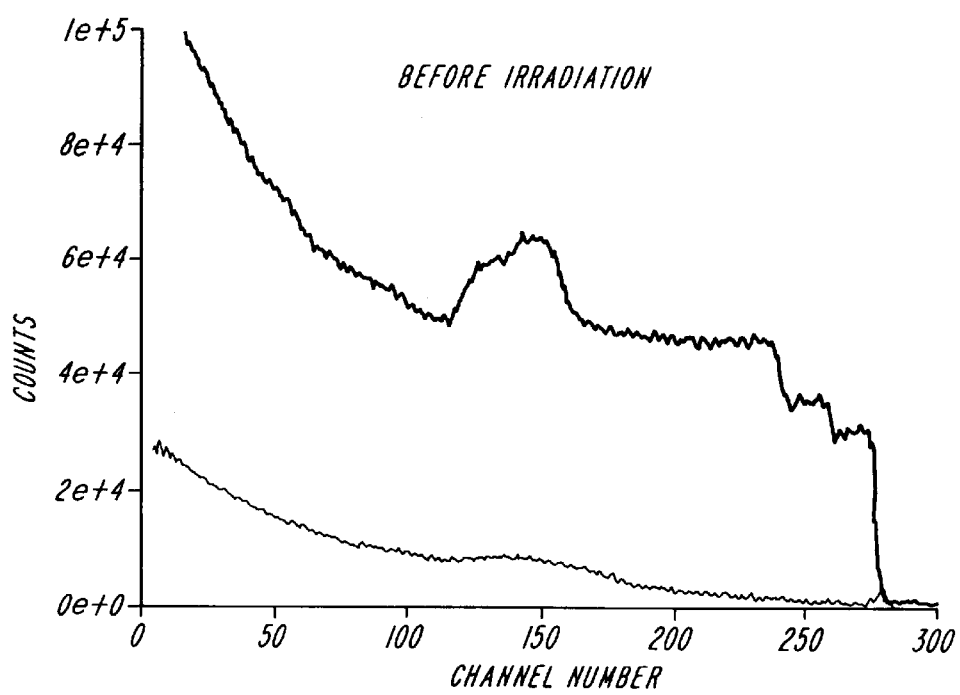
FIGS. 8A, 8B, 8C are graphs of surface peaks of the channeling spectra indicating the amount of surface damage before GCIB bombardment (FIG. 8A), after GCIB smoothing (FIG. 8B), and after GCIB smoothing and annealing at 870° C., 660° C. and 450° C. consecutively for 35 minutes each under flowing oxygen gas (FIG. 8C)
Figure 8B:
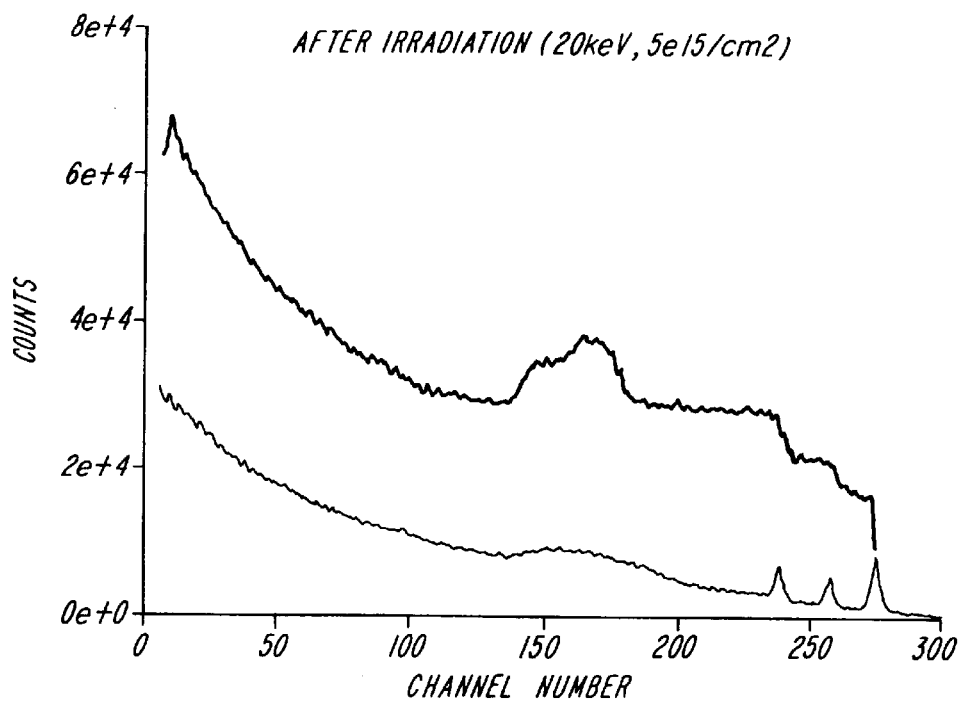
Figure 8C:
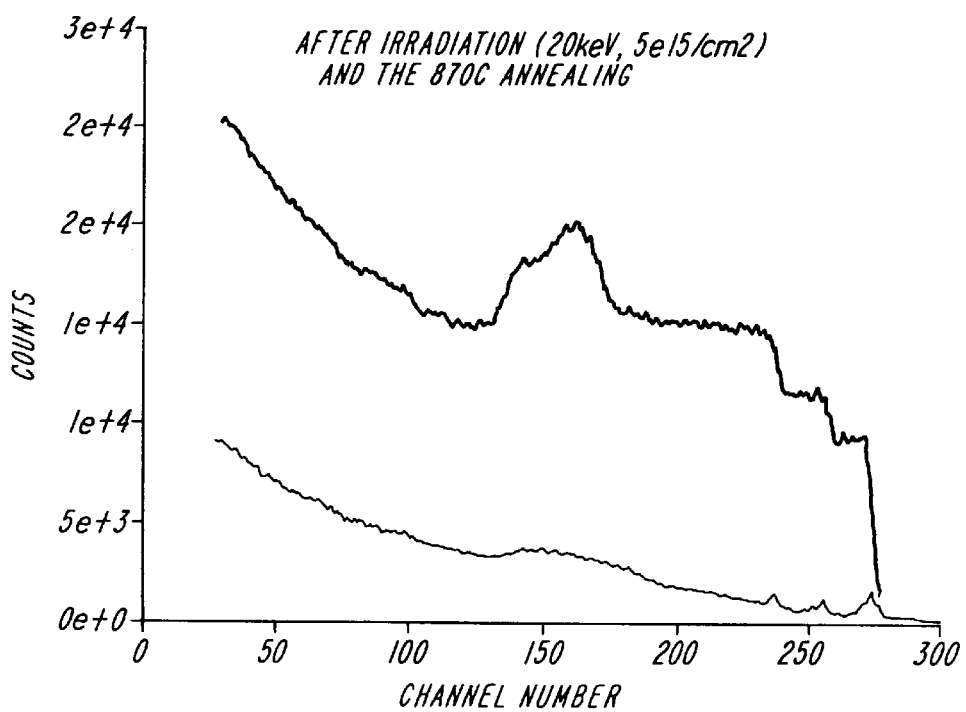

One schedule involves annealing the GCIB damaged HTS film at 800° C. under oxygen partial pressure of 100 mTorr for 30 minutes followed by a 450° C. and 200 mTorr oxygen pressure for another 30 minutes as a step during cooling down. The advantage of this annealing schedule is that these conditions are exactly the same as the film deposition procedure. A second annealing procedure is to anneal the GCIB treated surface at 870° C., 660° C. and 450° C. consecutively for 35 minutes each under flowing oxygen gas. FIGS. 8A–C are graphs of surface peaks of the channeling spectra indicating the amount of surface damage before GCIB bombardment (FIG. 8A), after GCIB smoothing (FIG. 8B), and after GCIB smoothing, then annealing at 870° C., 660° C. and 450° C. consecutively for 35 minutes each under flowing oxygen gas (FIG. 8C).

Both annealing methods produce excellent recovery of the GCIB damage. However, the high temperature annealing with flowing oxygen degrades the HTS film surface, if it has not been bombarded with GCIB. From these studies, it has been concluded that there is a very broad window for annealing of the GCIB damage. The important point is to keep the temperature high enough so that the crystal regrowth kinetics can keep the annealing time reasonably short. It is also desirable to keep the temperature below crystal melting, and below a second phase formation, and below chemical reaction between the film and its substrate and surroundings. With respect to oxygen partial pressure settings, it is preferable to have sufficient oxygen to repair the surface oxygen deficiency due to GCIB treatment, yet not too much oxygen to promote a second phase formation.

Figure 9:
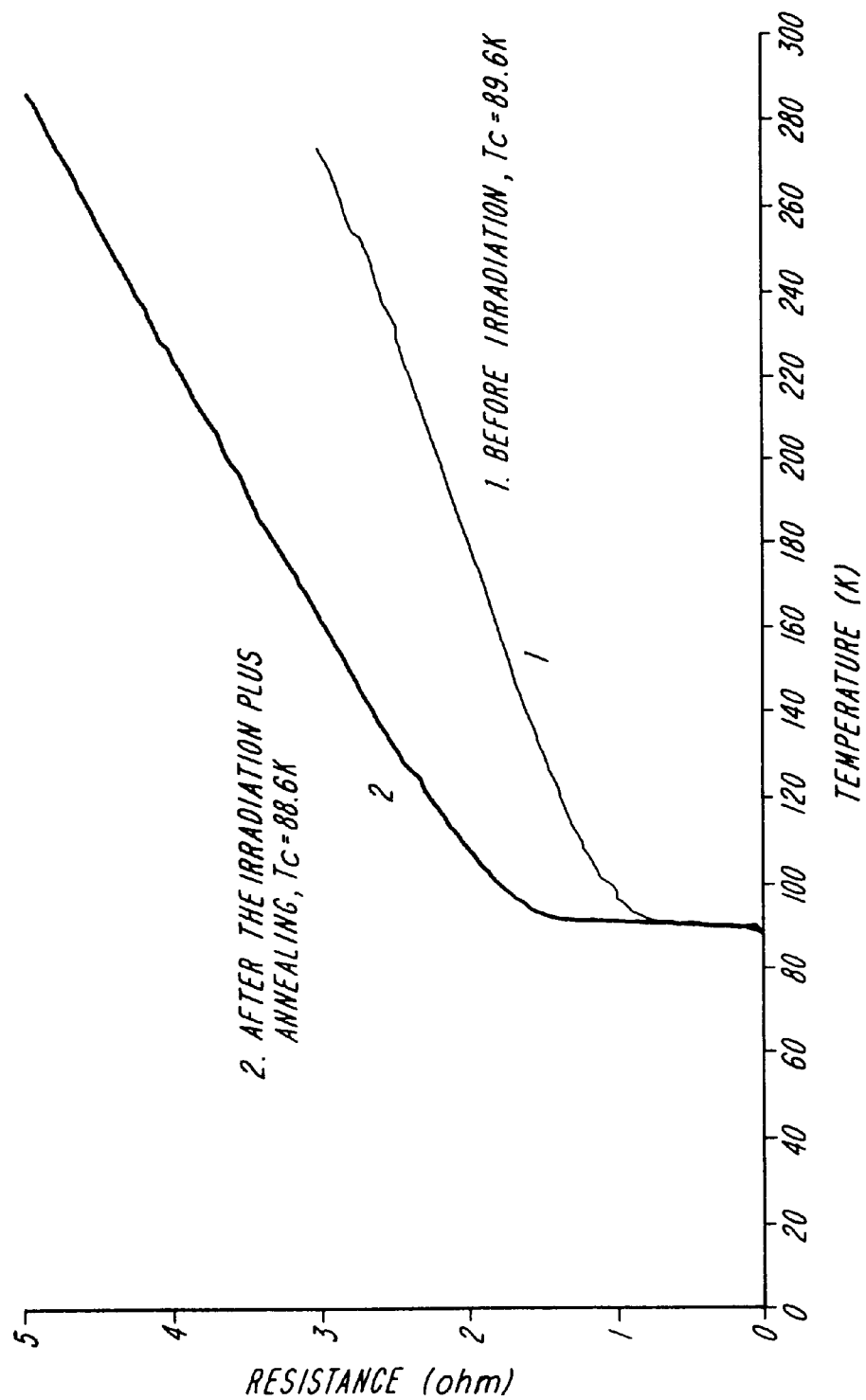
FIG. 9 is a graph showing the resistance versus temperature curve for a YBCO film before and after planarization with an Ar GCIB at 20 KeV, $2\times10^{16}$ clusters/cm$^2$, followed by annealing at 800° C.

GCIB bombarded and annealed samples have also been studied for their superconductivity properties. FIG. 9 is a graph showing the resistance versus temperature curve for a YBCO film before and after GCIB planarization at 20 KeV, $2 \times 10^{16}$ clusters/cm$^2$, followed by annealing at 800° C. A small shift of the transition temperature is observed, and the change of the normal state resistance is due to the thinning of the layer by GCIB sputtering. One of the best tests to make sure that the GCIB smoothing process and the annealing method work, is to grow additional HTS layers on top of the surface which underwent the smoothing and annealing process.

In one example, a pulsed laser ablated YBCO thin film is deposited, smoothed with 20 keV, $5 \times 10^{15}$ clusters/cm$^2$, and annealed with the annealing schedules described above. A YBCO film of 200 nm thickness is subsequently deposited on top of the smoothed and annealed surface in order to obtain homoepitaxial YBCO. The crystalline regrowth is verified by channeling in combination with RBS. Although the newly deposited film is single crystal, as expected the surface is rough as verified by AFM studies.

Accordingly, the final step of the invention involves additional processing for device fabrication (Step 106). If it is desired to build structures on top of this new layer, the GCIB smoothing needs to be repeated on the new layer. Smoothed multilayer systems can be constructed by sequencing the deposition, smoothing, annealing, and then repeating.

In summary, a GCIB smoothing technique has been demonstrated which can be applied to complicated HTS film. The radiation damage due to GCIB processing can be annealed out in ambient oxygen, and the restored surface can be used for additional homo, or hetero-epitaxial film growth. The disclosed process is essential to form multilayers, such as Multi-Chip-Module (MCM), using HTS for interconnections in semiconductor devices. It is equally important to improve the yield and reliability for HTS junction IC devices, as well as yield and reliability improvements for passive stripline delay lines, antennae, and filters using HTS films.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A method of processing a substrate comprising a high temperature crystalline superconductor surface, having a surface roughness $R_0$ and a transition temperature $T_c$, the method comprising:

(a) contacting the surface of the substrate with gas cluster ions, said cluster ions comprising at least one atomic species different from at least one atomic species in said superconductor surface, to reduce both the surface roughness and the crystallinity of the surface and to impair the high temperature superconducting properties of said surface; and (b) processing the surface of the substrate to restore the crystallinity and to at least partially restore the high temperature superconductivity of the surface.

2. The method of claim 1, wherein said processing step comprises thermally annealing the surface to restore crystallinity.

3. The method of claim 1, wherein said processing step comprises removing a shallow layer of the surface to expose underlying material having higher crystallinity.

4. The method of claim 1, wherein the superconductor surface comprises a YBCO type of superconductor.

5. The method of claim 1, wherein the contacting in step (a) comprises bombarding with gas cluster ions of having energies greater than 7 keV and less than 200 keV.

6. The method of claim 5, wherein the gas cluster ions have energies greater than 10 keV and less than 100 keV.

7. The method of claim 5, wherein the gas cluster ions have energies in the range from 15 to 35 keV.

8. The method of claim 1 further comprising:

(c) depositing a single crystal layer on the surface.

9. The method of claim 8 further comprising:
(d) processing said single crystal layer to configure structures thereon.

10. The method of claim 9, wherein said second processing step comprises smoothing said single crystal layer, and annealing the smoothed single crystal layer.

11. The method of claim 1, wherein said contacting step comprises bombarding said surface with gas cluster ions comprising a cluster in a range between 10 and 30 KeV with a total dose of $10^{14}$ to $2 \times 10^{16}$ clusters/cm$^2$.

12. The method of claim 1, wherein said annealing step comprises annealing the surface under a partial oxygen atmosphere.

13. The method of claim 12, wherein said annealing is carried out at approximately 800° C. under oxygen partial pressure of approximately 100 mTorr for approximately 30 minutes followed by an approximately 450° C. and 200 mTorr oxygen pressure for approximately 30 minutes.

14. The method of claim 12, wherein said annealing is carried out at approximately 870° C., 660° C., and 450° C. consecutively for approximately 35 minutes, each under flowing oxygen gas.

15. The method of claim 1, wherein said restored high temperature superconductivity occurs at a transition temperature near $T_c$.

16. A method of processing a substrate comprising:
(a) depositing a crystalline high temperature superconductor surface layer on said substrate, said layer having a surface roughness $R_0$ and a transition temperature $T_c$;
(b) bombarding said surface layer with gas cluster ion, said cluster ions comprising at least one atomic species different from at least one atomic species in said superconductor surface, to reduce the surface roughness to $R_1$, wherein $R_1$ is less than $R_0$, and to reduce the crystallinity of the surface layer and to impair the high temperature superconducting properties of said surface layer; and
(c) processing the surface layer of the substrate to restore the crystallinity and to at least partially restore the high temperature superconductivity of the surface layer.

17. The method of claim 16, wherein said processing step comprises thermally annealing the surface to restore crystallinity.

18. The method of claim 17, wherein said annealing step comprises annealing the surface in partial oxygen.

19. The method of claim 18, wherein said annealing is carried out at approximately 800° C. under oxygen partial pressure of approximately 100 mTorr for approximately 30 minutes followed by an approximately 450° C. and 200 mTorr oxygen pressure for approximately 30 minutes.

20. The method of claim 18, wherein said annealing is carried out at approximately 870° C., 660° C., and 450° C. consecutively for approximately 35 minutes, each under flowing oxygen gas.

21. The method of claim 16, wherein said processing step comprises removing a shallow layer of the surface to expose underlying material having higher crystallinity.

22. The method of claim 16, wherein said surface layer comprises a YBCO type of superconductor.

23. The method of claim 16 further comprising:
(d) depositing a single crystal layer on the surface.

24. The method of claim 23, wherein said single crystal layer comprises a superconducting layer.

25. The method of claim 23, further comprising:
(e) processing said single crystal layer to configure structures thereon.

26. The method of claim 23, wherein said single crystal layer comprises an insulating layer.

27. The method of claim 16, wherein said contacting step comprises bombarding said surface with gas cluster ions comprising a cluster in a range between 10 and 30 KeV with a total dose of $10^{14}$ to $2 \times 10^{16}$ clusters/cm$^2$.

28. The method of claim 13, wherein said restored high temperature superconductivity occurs at a transition temperature near $T_c$.

29. A method of processing a substrate comprising a high temperature crystalline superconductor surface, having a surface roughness $R_0$, the method comprising:
(a) contacting the surface of the substrate with gas cluster ions, said cluster ions comprising at least one atomic species different from at least one atomic species in said superconductor surface, to reduce both the surface roughness and the crystallinity of the surface and the impair the high temperature superconducting properties of the surface; and
(b) processing the surface of the substrate to restore the crystallinity of the surface and to at least partially restore the superconducting properties of the surface.

30. The method of claim 29, wherein said processing step comprises thermally annealing the surface to restore crystallinity.

31. The method of claim 29, wherein said processing step comprises removing a shallow layer of the surface to expose underlying material having higher crystallinity.

32. The method of claim 29, wherein the superconductor surface comprises a YBCO type of superconductor.

33. The method of claim 29, wherein the contacting in step (a) comprises bombarding with gas cluster ions of having energies greater than 7 keV and less than 200 keV.

34. The method of claim 29 further comprising:
(c) depositing a single crystal layer on the surface.

35. The method of claim 34 further comprising:
(d) processing said single crystal layer to configure structures thereon.

36. The method of claim 35, wherein said second processing step comprises smoothing said single crystal layer, and annealing the smoothed single crystal layer.

37. The method of claim 29, wherein said contacting step comprises bombarding said surface with gas cluster ions comprising a cluster in a range between 10 and 30 KeV with a total dose of $10^{14}$ to $2 \times 10^{16}$ clusters/cm$^2$.

38. The method of claim 29, wherein said annealing step comprises annealing the surface under a partial oxygen atmosphere.

39. The method of claim 38, wherein said annealing is carried out at approximately 800° C. under oxygen partial pressure of approximately 100 mTorr for approximately 30 minutes followed by an approximately 450° C. and 200 mTorr oxygen pressure for approximately 30 minutes.

40. The method of claim 38, wherein said annealing is carried out at approximately 870° C., 660° C., and 450° C. consecutively for approximately 35 minutes, each under flowing oxygen gas.

41. The method of claim 29, wherein said restored high temperature superconductivity occurs at a transition temperature near $T_c$.

42. A method of processing a substrate comprising:
(a) depositing a crystalline high temperature superconductor surface layer on said substrate, said layer having a surface roughness $R_0$;
(b) bombarding said surface layer with gas cluster ions, said cluster ions comprising at least one atomic species different from at least one atomic species in said superconductor surface, to reduce the surface roughness to $R_1$, wherein $R_1$ is less than $R_0$, and to reduce the crystallinity of the surface layer and to impair the high temperature superconducting properties of the surface layer; and (c) processing the surface layer of the substrate to restore the crystallinity and to at least partially restore the high temperature superconducting properties of the surface layer.

43. The method of claim 42, wherein said processing step comprises thermally annealing the surface to restore crystallinity.

44. The method of claim 43, wherein said annealing step comprises annealing the surface in the partial oxygen.

45. The method of claim 44, wherein said annealing is carried out at approximately 800° C. under oxygen partial pressure of approximately 100 mTorr for approximately 30 minutes followed by a approximately 450° C. and 200 mTorr oxygen pressure for approximately 30 minutes.

46. The method of claim 44, wherein said annealing is carried out at approximately 870° C., 660° C., and 450° C consecutively for approximately 35 minutes, each under flowing oxygen gas.

47. The method of claim 42, wherein said processing step comprises removing a shallow layer of the surface to expose underlying material having higher crystallinity.

48. The method of claim 42, wherein said surface layer comprises a YBCO type of superconductor.

49. The method of claim 42 further comprising:

(d) depositing a single crystal layer on the surface.

50. The method of claim 49, wherein said single crystal layer comprises an insulating layer.

51. The method of claim 49, wherein said single crystal layer comprises a superconducting layer.

52. The method of claim 49 further comprising:

(e) processing said single crystal layer to configure structures thereon.

53. The method of claim 49, wherein the gas cluster ions have energies greater than 10 keV and less than 100 keV.

54. The method of claim 49, wherein the gas cluster ions have energies in the range from 15 to 35 keV.

55. The method of claim 42, wherein said bombarding step comprises bombarding said surface with gas cluster ions comprising a cluster in a range between 10 and 30 KeV with a total dose of $10^{14}$ to $2\times10^{16}$ cluster/cm$^2$.

56. The method of claim 42, wherein said restored high temperature superconductivity occurs at a transition temperature near $T_c$.

* * * * *